(12) United States Patent
Klueppel et al.

(10) Patent No.: US 6,265,075 B1
(45) Date of Patent: Jul. 24, 2001

(54) CIRCUITIZED SEMICONDUCTOR STRUCTURE AND METHOD FOR PRODUCING SUCH

(75) Inventors: David Anton Klueppel, Broadview Heights, OH (US); Voya R. Markovich; Thomas Richard Miller, both of Endwell, NY (US); Timothy L. Wells, Apalachin, NY (US); William Earl Wilson, Waverly, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/357,574

(22) Filed: Jul. 20, 1999

(51) Int. Cl.[7] .................................................. H01L 29/12
(52) U.S. Cl. ........................ 428/418; 428/620; 428/621; 428/675; 428/668; 428/209; 428/220; 428/457; 428/596; 438/677; 438/678; 438/674; 438/687; 438/964; 430/315; 430/319
(58) Field of Search ..................... 427/304, 98; 428/901, 428/413, 418, 458, 620, 457, 675, 674, 668, 209, 220, 621, 622; 430/315, 319; 438/678, 677, 942, 964, 687, 674

(56) References Cited

U.S. PATENT DOCUMENTS

| Re. 28,042 | 6/1974 | Rhodenizer et al. ............... 117/212 |
| 2,908,557 | 10/1959 | Black et al. ....................... 41/42 |
| 3,011,920 | 12/1961 | Shipley, Jr. ....................... 117/213 |
| 3,083,129 | 3/1963 | Jones et al. ....................... 156/19 |
| 3,269,861 | 8/1966 | Schneble, Jr. et al. ............ 117/212 |
| 3,293,109 | 12/1966 | Luce et al. ....................... 161/166 |
| 3,522,085 | 7/1970 | Watanabe ......................... 117/212 |
| 3,562,038 | 2/1971 | Shipley, Jr. et al. ............... 156/3 |
| 3,563,784 | 2/1971 | Innes et al. ....................... 117/47 |
| 3,573,937 | 4/1971 | Sarna et al. ....................... 99/204 |
| 3,900,599 | 8/1975 | Feldstein ............................ 427/97 |
| 4,008,343 | 2/1977 | Cohen et al. ...................... 427/305 |
| 4,152,467 | 5/1979 | Alphaugh et al. ................. 427/8 |
| 4,262,085 | 4/1981 | Ehrich et al. ..................... 430/417 |
| 4,301,190 | 11/1981 | Feldstein .......................... 427/97 |
| 4,358,479 | 11/1982 | Canestaro ......................... 427/98 |
| 4,448,804 | 5/1984 | Amelio et al. .................... 427/98 |
| 4,554,182 | 11/1985 | Bupp et al. ...................... 427/304 |
| 4,640,718 | 2/1987 | Alnot et al. ....................... 134/2 |
| 5,017,271 | 5/1991 | Whewell et al. .................. 204/15 |
| 5,158,860 | 10/1992 | Gulla et al. ...................... 430/315 |
| 5,266,446 | * 11/1993 | Chang et al. . |
| 5,309,632 | 5/1994 | Takahashi et al. ................ 29/852 |
| 5,310,580 | 5/1994 | O'Sullivan et al. .............. 427/307 |
| 5,462,897 | 10/1995 | Baum et al. ..................... 437/230 |
| 5,468,597 | 11/1995 | Calabrese et al. ............... 430/315 |
| 5,509,557 | 4/1996 | Jimarez et al. ................... 216/95 |
| 5,785,787 | 7/1998 | Wojnarowski et al. .......... 156/155 |
| 5,792,594 | * 8/1998 | Brown et al. . |
| 6,020,266 | * 2/2000 | Hussein et al. . |
| 6,117,784 | * 9/2000 | Uzoh . |

FOREIGN PATENT DOCUMENTS 4-45281   2/1992   (JP) .

OTHER PUBLICATIONS

Research Disclosure No. 324026, Apr. 10, 1991.

* cited by examiner

*Primary Examiner*—Deborah Jones
*Assistant Examiner*—Wendy Boss
(74) *Attorney, Agent, or Firm*—Connolly, Bove, Lodge & Hutz, LLP.; Lawrence R. Fraley, Esq.

(57) ABSTRACT

A circuitized semiconductor structure comprising a layer of dielectric material, a catalyst seed layer above the layer of dielectric material, a layer of photoimageable dielectric material on the catalyst seed layer and having openings therein, a nickel layer in the openings and a layer of copper in the openings above the nickel layer and being coplanar with the top of the layer of dielectric material is provided, along with a method for its fabrication.

29 Claims, 2 Drawing Sheets

CIRCUITIZED SEMICONDUCTOR STRUCTURE AND METHOD FOR PRODUCING SUCH

TECHNICAL FIELD

The present invention relates to circuitized semiconductor structures and especially to structures having enhanced copper adhesion. The present invention makes it possible to provide fine line circuitized substrate structures. The present invention also provides a method for fabricating the circuitized semiconductor structure.

BACKGROUND OF INVENTION

In the manufacture of circuitized semiconductor carrier structures, a dielectric sheet material is employed as the substrate. A conductive circuit pattern is provided on one or both of the major surfaces of the substrate.

A conductive pattern can be formed on the surface of the substrate using a variety of known techniques. These known techniques include the subtractive technique, where a layer of copper is etched to form the desired circuit pattern, the EDR (electroless direct bond) technique, where copper is electrolessly plated directly on the surface of the substrate in the desired pattern, and the peel-apart technique, where the desired circuit pattern is plated up from a thin layer of peel-apart copper.

If it is desired to use the EDB technique, it is necessary to plate directly on the surface of the substrate.

Since the dielectric substrate is nonconductive, in order to plate on the substrate, the substrate must be seeded or catalyzed prior to the deposition of metal onto the substrate.

The electroless plating of copper onto a substrate is well-known in the art. For instance, an electroless or autocatalytic copper plating bath usually contains a cupric salt, a reducing agent for the cupric salt, a chelating or complexing agent, and a pH adjustor. In addition, if the surface being plated is not already catalytic for the deposition of the desired metal, a suitable catalyst is deposited onto the surface prior to contact with the plating bath. Among the more widely employed procedures for catalyzing a surface is the use of stannous chloride sensitizing solution and a palladium chloride activator to form a layer of metallic palladium particles.

Although the technology relative to electroless copper plating is continually being improved, there still remains room for additional improvement. Certain problems are specially pronounced when preparing structures having very fine line (down to 0.5 mil lines and 0.5 mil spaces) circuitization. The fine features typically have only been created for very short distances and only when needed for escaping a tight grid (down to 0.5 mm) pitch. Several problems currently exist that prohibit using thin film circuitization for global wiring on, for instance, rigid PWB (printed wire board).

The main problems are adhesion of the copper circuit to the laminate over long lengths (one inch or greater), insulation resistance between circuits as lines per channel increase, cross-sectional area of the circuits are limited with current techniques so that resistance losses prevent global wiring and use of current techniques is limited for build-up layers.

SUMMARY OF INVENTION

The present invention provides structures exhibiting high copper circuitry to substrate adhesion. Moreover, the present invention provides for excellent insulation resistance protection. The present invention also makes it possible to achieve long circuit lengths at a high density for global wiring. The present invention permits global wiring for a very dense and high I/O package.

More specifically, the present invention provides a circuitized semiconductor structure which comprises:

a layer of dielectric material;

a catalyst seed layer located on the layer of dielectric material;

a layer of photoimageable dielectric material on the catalyst seed layer and having openings therein for exposing portions of the catalyst seed layer;

a layer of nickel deposited in the openings of the layer of photoimageable dielectric material and on top of the catalyst seed layer; and a layer of copper plating in the openings and over the layer of nickel and being coplanar with the top of the layer of photoimageable dielectric material.

The present invention also relates to fabricating the above disclosed circuitized semiconductor structure. The method comprises:

providing a layer of dielectric material;

depositing a catalyst seed layer on the layer of dielectric material;

depositing a layer of photoimageable dielectric material on the catalyst seed layer;

imagewise exposing the layer of photoimageable dielectric material and developing to provide openings in the layer of photoimageable dielectric material to expose portions of the catalyst seed layer;

depositing a layer of nickel in the openings of the layer of photoimageable dielectric material and on top of the catalyst seed layer; and depositing a layer of copper plating in the openings and over the layer of nickel, and wherein the layer of copper plating is coplanar with the top layer of the layer of photoimageable dielectric material.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures.

Figure 1:
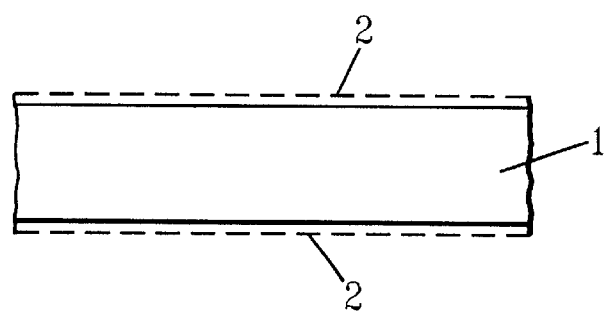
FIGS. 1–5 are schematic representations of structures at various stages according to the process of the present invention.

FIG. 1 shows a layer or substrate of dielectric material 1. A wide variety of dielectric (non-conductive) substrates can be employed and, as described in the prior art, include thermoplastic and thermosetting resins.

Typical thermosetting polymeric materials include epoxy, phenolic based materials, and polyamides. The dielectric materials may be molded articles of the polymers containing fillers and/or reinforcing agents, such as glass-filled epoxy or phenolic based materials. Examples of some phenolic type materials include copolymers of phenol, resorcinol and cresol. Examples of some suitable thermoplastic polymeric materials include polyolefins, such as polypropylene, polysulfones, polycarbonates, nitrile rubbers, ABS polymers and fluorinated polymeric materials such as polytetrafluoroethylene.

More typically, the dielectric substrates employed are FR-4 epoxy compositions.

A typical FR-4 epoxy composition contains 70–90 parts of brominated polyglycidyl ether of bisphenol-A and 10–30 parts of tetrakis (hydroxyphenyl) ethane tetraglycidyl ether cured with 3 to 4 parts of dicyandiamide, and 0.2 to 0.4 parts of a tertiary amine, all parts being parts by weight per 100 parts of resin solids.

Another typical FR-4 epoxy composition contains:
a) about 25 to about 30 parts by weight of a tetrabrominated diglycidyl ether of bisphenol-A having an epoxy equivalent weight of about 350 to about 450;
b) about 10 to about 15 parts by weight of a tetrabrominated diglycidyl ether of bisphenol-A having an epoxy equivalent weight of about 600 to about 750; and
c) about 55 to about 65 parts by weight of at least one epoxidized non-linear novolak, having at least terminal epoxy groups, along with suitable curing and/or hardening agents.

Another typical FR-4 epoxy composition contains about 70 to about 90 parts of brominated polyglycidyl ether of bisphenol-A, and 10 to 30 parts of tetrakis (hydroxyphenyl) ethane tetraglycidyl ether cured with 0.8 to 1 part of 2-methyl imidazole.

Still another FR-4 epoxy composition employs tetrabromo bisphenol-A as the curing agent, along with 2-methyl imidazole as the catalyst.

The dielectric layer 1 is contacted with a composition containing a catalytic composition capable of initiating an electroless plating process providing a catalyst seed layer 2. If desired, the catalyst seed layer 2 can be provided on both major surfaces of dielectric layer 1.

The compositions contain a metal which can directly provide the catalytic sites, or serve as a precursor which leads to the catalytic sites. The metal present may be in the elemental form, an alloy, or compound, or mixtures thereof. The preferred metal catalysts are precious metals, such as gold, palladium, and platinum. A typical palladium composition contains about 1.2 to about 2.5 grams per liter of a palladium salt, which is preferably $PdCl_2$, about 80 to about 150 grams per liter of a stannous salt, which is preferably $SnCl_2 \cdot 2H_2O$, and about 100 to about 150 milliliters per liter of an acid which is preferably HCl. When HCl is provided in the form of a 37% HCl solution, about 280 to about 360 milliliters of the HCl solution is preferably employed. The most preferred composition contains about 1.5 grams per liter of $PdCl_2$ and about 280 milliliters per liter of 37% HCl. The composition is usually maintained at a temperature of about 65°±10° F.

A typical triple-seeder process is disclosed, for instance, in Alpaugh et al U.S. Pat. No. 4,525,390, disclosure of which is incorporated herein by reference.

Subsequently, the substrate can be treated with an acid or alkaline accelerator such as a 2% NaOH solution to remove excess tin which is typically deposited along with the Pd catalyst. This step usually takes about 1 to about 5 minutes and, more typically, about 1 to about 2 minutes.

The substrates can then be dried, such as by being vacuum dried in an oven for 30 minutes at a temperature of about 100° C. In the drying operation, all the water is driven off irreversibly from the colloidal particles, leaving a shell of oxygen in the form of insoluble tin oxide.

Moreover, if desired, prior to providing the catalyst seed layer 2, the dielectric layer 1 can be treated with an acidic solution containing a multifunctional ionic copolymer containing at least two available cationic functional moieties. The preferred ionic moieties are quaternary phosphonium and quaternary ammonium groups. Copolymers containing at least two cationic moieties such as, for example, copolymers of polyacrylamide forming the inert backbone and functionally active tetraalkylammonium compounds, are commercially available and need not be described herein in detail. Multifunctional cationic copolymers of that type are Reten 210 and Reten 220, available from HERCULES, description of which can be found in "Water-Soluble Polymers", Bulletin VC-482A, HERCULES, Inc., Wilmington, Del., 1989, disclosure of which is incorporated herein by reference.

Reten 210 is in powder form and is a copolymer of acrylamide and beta-methacryloxyethyltrimethylammonium methyl sulfate, of which a 1% solution has a Brookfield viscosity of 600–1000 cps. Reten 220 is also in powder form and consists of the same monomers as Reten 210, but its 1% solution has a Brookfield viscosity of 800–1200 cps. The molecular weights of the Reten polymers are usually relatively high and vary from about 50,000 to about 1,000,000 or more. The quaternary ammonium groups provide the number of positive charges of the polymer.

In the preferred aspects of the present invention, the ionic copolymer is employed as a dilute acidic solution of about 0.01% to about 1% by weight, and preferably about 0.05% to about 0.5% by weight of the copolymer. The acid is contained in the solution is preferably $H_2SO_4$, and the pH value of the solution is between 0 and about 3. The use of a low pH value is preferred to obtain a relatively low viscosity of the copolymer solution to facilitate application of the polymer. The treatment with the ionic copolymer is generally about 1 minute to about 10 minutes, and preferably about 1 minute to about 2 minutes, and takes place at about room temperature.

The multifunctional copolymer, having a very good adhesion to the substrate surface, provides the surface with a charge opposite from that associated with the seed particles 2 applied to the substrate. This difference in polarity provides for electrostatic attraction of the seed particles. After the substrate is brought into contact with the ionic copolymer composition, the substrate is rinsed to remove any excess polymer not adhering to the substrate surface.

Moreover, if desired, prior to providing the catalyst seed layer 2 and multifunctional ionic copolymer, if employed, the dielectric layer 1 is roughened to enhance its ability to adhere to the catalyst seed layer 2. This can be carried out by laminating a layer of a conductive metal having a roughened surface, such as a copper sheet, onto at least one of the major surfaces of the dielectric substrate 1. This is carried out by pressing the roughened surface of the copper sheet against the substrate surface.

The layer of conductive metal can have a roughened surface with the morphology discussed in U.S. Pat. No. 5,509,557 to Jimarez et al, or of the type disclosed in U.S. Pat. No. 4,358,479 to Canestaro et al, both disclosures of which are incorporated herein by reference.

Bonding of a dielectric material substrate 1 to the metal foil can be carried out by pressing together a sheet of the dielectric substrate material, and a sheet of the foil with the roughened surface next to or confronting the dielectric material, in a preheated laminating press at a predetermined pressure and temperature as for example, about 260 to about 800 psi, and preferably about 500 psi and about 340° F. The time of the pressing operation is variable, depending upon the particular dielectric substrate material employed and the pressure employed. About 1 hour is adequate for the above conditions. The pressing can be done by loading a stack of panels on top of each other in the press. A practical amount is about 12 panels.

Next, the foil is removed from the entire dielectric substrate surface chemically by treating with an etchant, and preferably by immersion of the structure into the etching bath. In the case of copper foil, a copper etchant is employed. Copper etchant compositions are well known and include, for instance, solutions of cupric chloride, ferric chloride, sodium peroxydisulfate, ammoniacal chlorite, ammoniacal persulfate and nitric acid. In general, all stripping solutions are operative in the practice of the present invention so long as they do not cause excessive attack of the dielectric substrate material.

After this, it is generally suitable to subject the board to a water rinse and/or a mild alkali bath rinse to clean the board.

Figure 2:
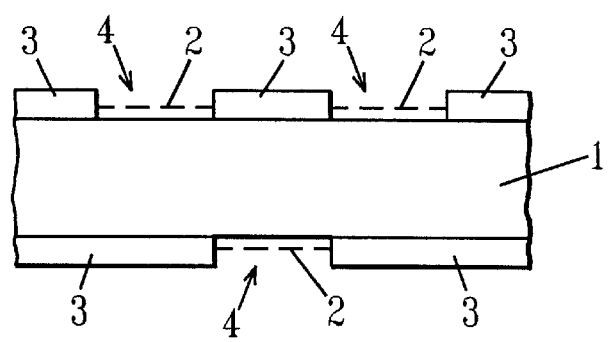

As illustrated in FIG. 2, a layer 3 of photoimageable material is applied above the seed layer 2 and, if desired, can be applied to both major surfaces of dielectric layer 1. The photoimageable material employed is a dielectric and curable so that it becomes a permanent constituent of the structure of the present invention. The photosensitive coating composition acts as a positive-acting photoresist. In other words, upon imagewise exposure, the exposed portions are cross-linked. Accordingly, upon development the unexposed portions are removed, for example by dissolution in a suitable solvent. These removed areas will then expose the previously catalyzed substrate surface. These channels then become the openings in which the subsequent metallizations will occur. Examples of suitable photoimageable dielectric materials are disclosed in U.S. Pat. Nos. 5,026,624 and 5,330,402, disclosures of which are incorporated herein by reference.

The photoresists of U.S. Pat. Nos. 5,026,624 and 5,300,402 are photoimageable cationically polymerizable epoxy based materials. The material includes an epoxy resin system containing a polyol resin which is a condensation product of epichlorohydrin and bisphenol A. To this resin system is added about 0.1 to about 15 parts by weight per 100 parts of resin of a cationic photoinitiator capable of initiating polymerization of the epoxidized resin system upon exposure to actinic radiation; the system being further characterized by having an absorbance of light in the 330 to 700 nm region of less than 0.1 for a 2.0 mil thick film. Optionally, a photosensitizer such as perylene and its derivatives or anthracene and its derivatives may be added.

The photoresist system provides very high resolution and the ability to image very fine features while maintaining adhesion to the base substrate laminate. The photoresist being an epoxy based system, is compatible with numerous wet chemical processes, a feature essential for its use as a permanent layer.

The layer 3 is typically about 12 to about 38 microns thick and more typically about 20 to about 30 microns thick.

The layer of photoimageable material is then selectively exposed to the desired pattern and imaged by a known technique, such as ultraviolet light, electron beam or x-ray bean technique, followed by removal of the unexposed portions by etching or dissolution in an appropriate liquid.

For the photoresist, the exposure is typically performed with UV radiation at a dose of about 1000 to about 1500 Joules/sq. cm. This is followed by a bake operation to accelerate cure. Developing is performed in any solvent based process known in the industry, but more typically a propylene carbonate or benzyl alcohol solution at about 50 to about 60° C. in a conveyorized spray tool. The material typically undergoes a final cure through a UV dose and a base at about 180° C.

The developing provides openings 4 in the dielectric layer 3 and exposes underlying catalyst seed layer 2.

Figure 3:
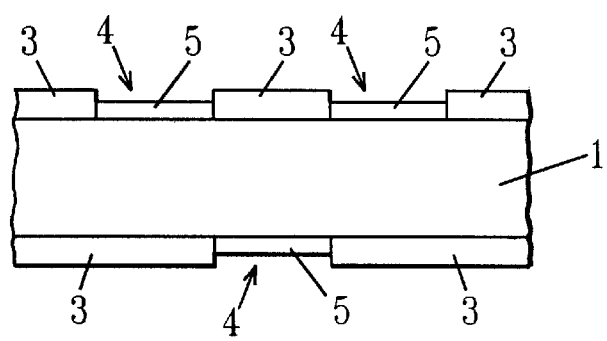

Next, nickel 5 is plated from an electroless nickel plating on the catalyst seed layer 2 in the openings, but not on the dielectric layer 3. See FIG. 3. Plating chemistries for electroless nickel plating are well known in the industry and need not be described herein in any detail.

Typical methods for depositing nickel on the surface or surfaces of a substrate involve immersing the substrate in an aqueous solution comprising as ingredients a source of nickel ions, a soluble reducing agent for the nickel, a metal complexing agent and pH adjusting agents under conditions effective to bring about electroless deposition of nickel on the surface or surfaces by means of chemical reduction.

The nickel plating can be referred to as flash or strike plating, and is typically about 0.5 to about 5 microns thick and more typically about 2.5 to about 3.5 microns thick. Flash or strike plating baths are more active but more difficult to control and therefore are suitable for relatively thin layers but not for the thicknesses needed for circuit lines.

It is important according to the present invention that the nickel plating be carried out after the development of the layer of photoimageable material 3 since it eliminates the possibility of electrical leakage between lines. If plated before the layer of photoimageable material, the presence of nickel beneath the layer of photoimageable material could result in electrical leakage between lines, especially when spaced relatively close to each other. In addition, the nickel bath is generally more active than a copper plating bath. Accordingly, circuitization yields are higher because the line will have fewer defects.

It has been found that the nickel provides for enhanced adhesion of the copper to the substrate.

Figure 4:
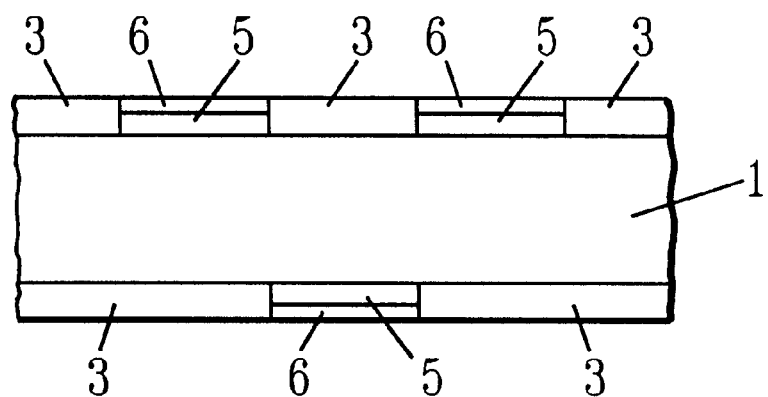

Next, copper 6 is plated in the openings 4 from an electroless plating bath to provide the desired line thickness. See FIG. 4. If desired, both major surfaces of layer 1 can be plated. Examples of suitable electroless copper plating baths can be found in U.S. Pat. Nos. 5,509,557, 4,707,377 and 4,904,506, disclosures of which are incorporated herein by reference.

The copper electroless plating bath employed is generally an aqueous composition, which contains a source of cupric ion, a complexing agent for the cupric ion, and a pH adjustor, in addition to the cyanide ion source and oxygen. In addition, the plating bath also preferably includes a surface-active agent.

The cupric ion source generally used is a cupric sulfate or a cupric salt of the complexing agent to be employed.

The cupric ion source in the electroless plating bath is typically employed in amounts of about 9 to about 14, and more typically about 10 to about 12 grams per liter, calculated as $CuSo_4 \cdot 5H_2O$.

The most common reducing agent employed is formaldehyde. Examples of some other reducing agents include formaldehyde precursors or formaldehyde homopolymers, such as paraformaldehyde, trioxane, and gloxal; borohydrides such as alkali metal borohydrides (sodium and potassium borohydrides) and substituted borohydrides such as sodium trimethoxy borohydride; boranes such as amine borane (isopropyl amine borane and morpholine borane); and hypophosphite reducing agents.

The reducing agent is generally present in amounts from about 1 to about 4 milliliters per liter, and more typically from about 2 to about 2.5 milliliters per liter.

Examples of some suitable complexing agents include Rochelle salts, ethylene diamine tetraacetic acid, the sodium (mono-, di-, tri-, and tetra-sodium) salts of ethylene diamine tetraacetic acid, nitrilo tetraacetic acid and its alkali salts, gluconic acid, gluconates, triethanol amine, glucono (gamma)-lactone, modified ethylene diamine acetates such as N-hydroxy ethyl ethylene diamine triacetate. In addition, a number of other suitable cupric complexing agents are suggested in U.S. Pat. Nos. 2,996,408; 3,075,856; 3,076,855 and 2,938,805. The preferred complexing agents are ethylene diamine tetraacetic acid and the alkali metal salts thereof.

The amount of complexing agent employed is typically about 25 to about 50 grams per liter.

The plating bath can also include a surfactant which assists in wetting the surface to be coated. A satisfactory surfactant is, for instance, an organic phosphate ester, available under the trade designation "Gafac RE-610". Generally, the surfactant, if present, is used in amounts from about 0.01 to about 0.3 grams per liter.

In addition, the pH of the bath is generally controlled, for instance, by the addition of a basic compound, such as sodium hydroxide or potassium hydroxide in the desired amount to achieve the desired pH. The typical pH of the copper electroless plating bath is between 11.5 and 12.0, and more typically between 11.7 and 11.9.

In addition, the plating bath can include other minor additives as is known in the art.

The typical plating baths employed have a specific gravity within the range of 1.06 to 1.08. Moreover, the temperature of the bath is typically maintained between about 70° C. and 80° C., more typically between about 70° C. and 76° C., and preferably about 72° C. to about 75° C.

The copper electroless plating bath typically contains about 5 to about 11 ppm, and more typically about 5 to about 8 ppm of cyanide ions.

Examples of some cyanides are the alkali metal, alkaline earth metal, and ammonium cyanides, with sodium cyanide being a more typical example.

The electroless plating bath typically has an oxygen content of not lower than 1.5 ppm below saturation, and more typically an oxygen content of not lower than 1.0 ppm below saturation.

The plating from the copper electroless plating bath is generally from about 8 to about 20 hours, or until the desired thickness of copper film is achieved, which is typically about 0.7 mils to about 1.8 mils.

It is generally desired that the copper be coplanar with the top of the dielectric layer 3. If needed, the copper can be subjected to polishing for planarization.

The presence of the dielectric layer 3 makes possible plated copper lines having sides perpendicular to the substrate layer 1, thereby providing square or rectangular lines. This is contrasted to the generally trapezoidal lines formed when the lines are created by blanket plating copper followed by etching to define the lines. The square or rectangular copper lines exhibit improved impedance control as well as requiring reduced real estate as compared to trapezoidal lines.

The present invention makes possible copper lines of about ½ mil wide spaced apart by ½ mil. This provides lines having 1 ½ pitch. The copper lines are typically about 2 mils to about ½ mil wide and spaced apart by about 2 mils down to about ½ mil.

Figure 5:
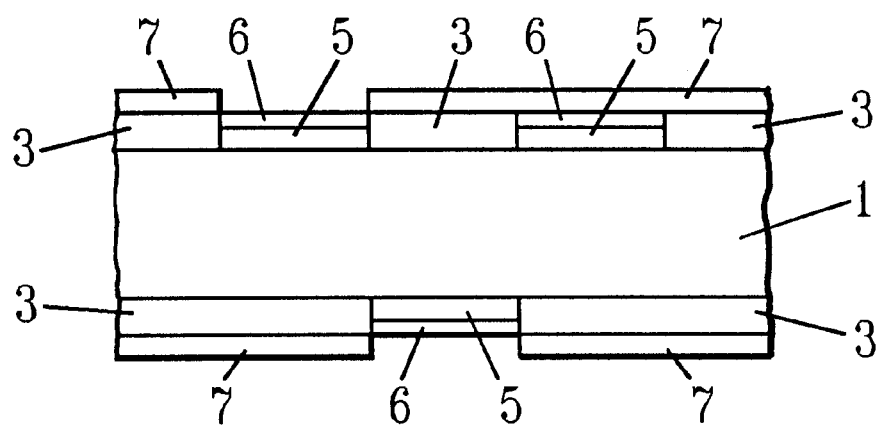

In addition, as illustrated in FIG. 5, optionally a solder mask or further insulating layer 7 can be provided over selected copper lines while leaving others uncoated for subsequent possible metallization such as with gold or solder.

If desired, the same material as the photoimageable dielectric can be used as the solder mask layer as well. This is because of it being an epoxy based material, adhesion to itself is very good. Also, liquid or dry film solder marks available in the industry such as PSR4000AUS5 from Taiyo (liquid) or Vacrel (Dupont) can be used. The choice of dry film or liquid is generally based on the resolution needed. Liquids can resolve finer features, but depends on options below.

The solder mask choice is based upon the surface finishing steps. For example, if an OSP (organic surface protection—such as ENTEK) is applied, then any solder mask can be used with the preferred choice being the least expensive—dry film. If the product needs gold plating, there are two options—blanket plate all features and then apply solder mask or apply solder mask and selectively plate only those features to be gold plated.

Doing selective plating is easier since one applies the same material used as a permanent resist, carry out the same photo operations and open windows to plate gold or palladium only where needed. This is the less expensive in process steps and amount of precious metal plated. Also, many other solder masks are not compatible with the precious metal processes, so to do a selective plate requires applying a plating resist, photo operations, plating stripping, resist and then applying solder mask. Although this can be carried out, the above is preferred.

The second way is to blanket plate. This requires more coordination. The permanent resist layer would have to be thicker and not plated flush to leave room for the additional precious metal plating. Otherwise, plating over the top can occur resulting in mushroom features. If desired, the precious metal can be plated in the existing channels over all exposed copper features, followed by a solder mask. This is somewhat more expensive because more precious metal is used. However, in some cases this cost is less than selective coating.

For selective metal plating on the copper, a metallization layer (not shown) is provided onto copper 6 in the open areas.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A circuitized semiconductor structure comprising:
a layer of dielectric material;
a metallic catalyst seed layer located on the layer of dielectric material;
a layer of photoimageable dielectric material on the catalyst seed layer and having openings therein for exposing portions of the catalyst seed layer;
a layer of nickel deposited in the openings of the layer of photoimageable dielectric material and on top of the catalyst seed layer; and
a layer of copper plating in the openings and over the layer of nickel and being coplanar with the top of the layer of photoimageable dielectric material.

2. The semiconductor structure of claim 1 wherein the layer of dielectric material comprises epoxy resin optionally reinforced.

3. The semiconductor structure of claim 1 wherein the catalyst seed layer is from a palladium/tin colloidal suspension.

4. The semiconductor structure of claim 1 wherein the layer of dielectric material has a roughened surface.

5. The semiconductor structure of claim 1 wherein the layer of photoimageable material comprises photoimageable cationically polymerizable epoxy based materials.

6. The semiconductor structure of claim 1 wherein the layer of photoimageable material is about 20 to about 30 microns thick.

7. The semiconductor structure of claim 1 wherein the layer of photoimageable material is about 12 to about 50 microns thick.

8. The semiconductor structure of claim 1 wherein the layer of nickel is about 1 to about 5 microns thick.

9. The semiconductor structure of claim 1 wherein the layer of nickel is about 2.5 to about 3.5 microns thick.

10. The semiconductor structure of claim 1 wherein the openings are about ½ mil to about 2 mils wide and about ½ mil to about 2 mils spaced apart.

11. The semiconductor structure of claim 1 wherein a catalyst seed layer, a layer of photoimageable dielectric material, a layer of nickel and a layer of copper plating are on both major surfaces of the layer of dielectric material.

12. The semiconductor structure of claim 11 which further includes a solder mask or further insulating layer located over selected copper lines.

13. The semiconductor structure of claim 1 which further includes a solder mask or further insulating layer located over selected copper lines.

14. A method for fabricating a circuitized semiconductor structure comprising:
providing a layer of dielectric material;
depositing a catalyst seed layer on the layer of dielectric material;
depositing a layer of photoimageable dielectric material on the catalyst seed layer;
imagewise exposing the layer of photoimageable dielectric material and developing to provide openings in the layer of photoimageable dielectric material to expose portions of the catalyst seed layer;
depositing a layer of nickel in the openings of the layer of photoimageable dielectric material and on top of the catalyst seed layer; and
depositing a layer of copper plating in the openings and over the layer of nickel, and wherein the layer of copper plating is coplanar with the top layer of the layer of photoimageable dielectric material.

15. The method of claim 14 wherein the layer of dielectric materal comprises epoxy resin optionally reinforced.

16. The method of claim 14 wherein the catalyst seed layer is deposited from a palladium/tin colloidal suspension.

17. The method of claim 14 which further comprises roughening the layer of dielectric material by bonding a metal foil with a roughened surface confronting the dielectric material and then removing the metal foil by etching.

18. The method of claim 14 wherein the layer of photoimageable material comprises photoimageable cationically polymerizable epoxy based materials.

19. The method of claim 14 wherein the layer of photoimageable material is about 20 to about 30 microns thick.

20. The method of claim 14 wherein the layer of photoimageable material is about 12 to about 50 microns thick.

21. The method of claim 14 which comprises depositing the layer of nickel to provide a thickness of about 1 to about 5 microns.

22. The method of claim 14 which comprises depositing the layer of nickel to provide a thickness of about 2.5 to about 3.5 microns.

23. The method of claim 14 wherein the openings are about ½ mil to about 2 mils wide and about ½ mil to about 2 mils spaced apart.

24. The method of claim 14 which comprises electrolessly depositing the copper.

25. The method of claim 14 which comprises providing a layer of dielectric material, depositing a catalyst seed layer, depositing a layer of photoimageable dielectric material, depositing a layer of nickel and depositing a layer of copper on both major surfaces of the layer of dielectric material.

26. The method of claim 25 which further comprises providing a solder mask or further insulating layer located over selected copper lines.

27. The method of claim 14 which further comprises providing a solder mask or further insulating layer located over selected copper lines.

28. The method of claim 14 which further comprises planarizing the layer of copper by mechanical polishing.

29. A circuitized semiconductor substrate obtained by the method of claim 14.

* * * * *